(12) United States Patent
Govig et al.

(10) Patent No.: US 7,725,856 B1
(45) Date of Patent: May 25, 2010

(54) METHOD AND APPARATUS FOR PERFORMING PARALLEL SLACK COMPUTATION

(75) Inventors: Jason Govig, San Jose, CA (US); David Karchmer, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 371 days.

(21) Appl. No.: 11/603,563

(22) Filed: Nov. 22, 2006

(51) Int. Cl.
*G06F 17/50* (2006.01)

(52) U.S. Cl. ............... 716/7; 716/6; 716/18; 703/16

(58) Field of Classification Search ............ 716/7, 716/18, 6; 703/16
See application file for complete search history.

(56) References Cited

U.S. PATENT DOCUMENTS

| | | | |
|---|---|---|---|
| 6,523,155 B1 * | 2/2003 | Ruedinger | 716/7 |
| 6,536,024 B1 * | 3/2003 | Hathaway | 716/6 |
| 6,550,045 B1 * | 4/2003 | Lu et al. | 716/6 |
| 7,000,214 B2 * | 2/2006 | Iadanza et al. | 716/18 |
| 7,124,342 B2 * | 10/2006 | Wang et al. | 714/741 |
| 2005/0108667 A1 * | 5/2005 | Iadanza et al. | 716/4 |
| 2005/0229123 A1 * | 10/2005 | Wang et al. | 716/4 |
| 2005/0235232 A1 * | 10/2005 | Papanikolaou et al. | 716/1 |
| 2007/0204252 A1 * | 8/2007 | Furnish et al. | 716/10 |
| 2008/0134107 A1 * | 6/2008 | Wang et al. | 716/2 |
| 2008/0134115 A1 * | 6/2008 | Ly et al. | 716/5 |

* cited by examiner

*Primary Examiner*—Phallaka Kik
(74) *Attorney, Agent, or Firm*—L. Cho (57) ABSTRACT

A method for designing a system on a target device is disclosed. Domains and sub-domains in the system are identified. Chunks are identified from the domains and sub-domain. Slacks for the chunks are computed in parallel. Other embodiments are described and claimed.

21 Claims, 6 Drawing Sheets

METHOD AND APPARATUS FOR PERFORMING PARALLEL SLACK COMPUTATION

FIELD

The present invention relates to electronic design automation (EDA) tools. More specifically, the present invention relates to a method and apparatus for performing parallel slack computations using an EDA tool.

BACKGROUND

Electronic designs may be large systems that include millions of gates and megabits of embedded memory. Of the tasks required in managing and optimizing electronic designs on a target device, synthesis, placement, and routing utilizing available resources can be among the most challenging and time consuming. The complexity of large systems often requires the use of electronic design automation (EDA) tools to manage and optimize designs. EDA tools perform the time-consuming tasks of synthesis, placement, and routing on a target device.

Some EDA tools also performing timing analysis on a design. The timing analysis may be performed after synthesis, placement, and/or routing in order to confirm that the design for the system meets timing requirements. Timing analysis may also be performed after synthesis, placement, and/or routing in order to evaluate solutions generated by one or more of the procedures. The results from timing analysis may be used to re-run one or more of the procedures in efforts to improve a solution. The main task of timing analysis is the computation of slack values. Slack may be defined as the difference between a data arrival time and a data required time.

The procedures used for computing slack values for a design may require a significant amount of processor execution time. When timing analysis is used to compute slack for a plurality of stages in the design flow, significant delays may be incurred in the design process.

Thus, what is needed is an EDA tool that is able to perform parallel slack computation.

BRIEF DESCRIPTION OF THE DRAWINGS

The features and advantages of embodiments of the present invention are illustrated by way of example and are not intended to limit the scope of the embodiments of the present invention to the particular embodiments shown.

SUMMARY

According to an exemplary embodiment of the present invention, a timing analysis unit identifies a plurality of domains and sub-domains from a netlist for a design of a system. The timing analysis unit defines chunks to be processed from the identified domains and sub-domains to compute slack values. Threads supported by a multi-processor or multi-core system are each assigned a chunk to be processed in parallel. By performing slack computations in the chunks in parallel, improved runtime performance is achieved.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
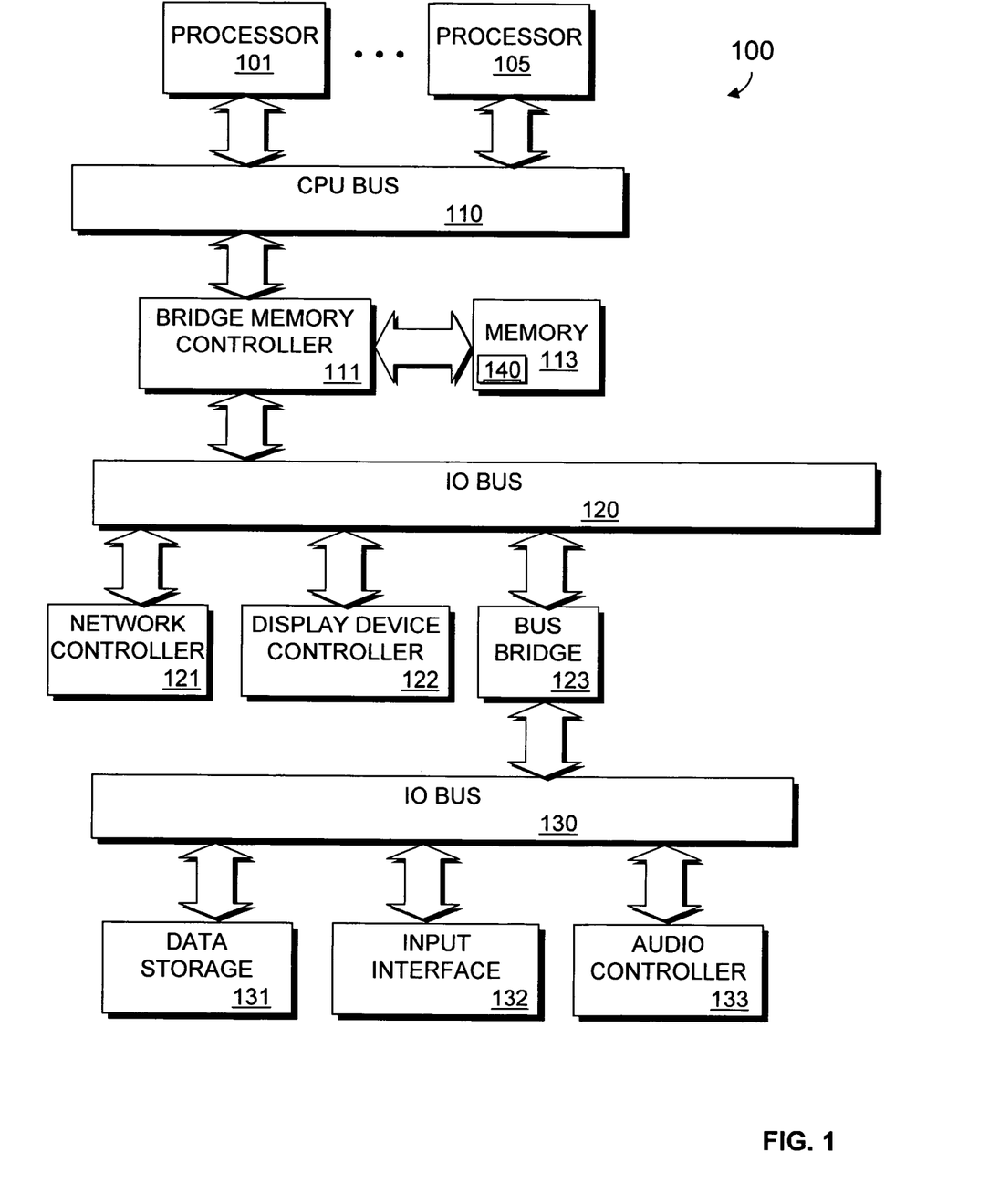
FIG. 1 is a block diagram that illustrates a computer system in which an exemplary embodiment of the invention resides.

FIG. 1 is a block diagram of an exemplary computer system 100 in which an example embodiment of the present invention resides. The computer system 100 includes one or more processors that process data signals. As shown, the computer system 100 includes a first processor 101 and an nth processor 105, where n may be any number. The processors 101 and 105 may be a complex instruction set computer microprocessor, a reduced instruction set computing microprocessor, a very long instruction word microprocessor, a processor implementing a combination of instruction sets, or other processor device. The processors 101 and 105 may be multi-core processors with multiple processor cores on each chip. Each of the processors 101 and 105 and each of the processor cores may support one or more hardware threads. The processors 101 and 105 are coupled to a CPU bus 110 that transmits data signals between processors 101 and 105 and other components in the computer system 100.

The computer system 100 includes a memory 113. The memory 113 may be a dynamic random access memory device, a static random access memory device, and/or other memory device. The memory 113 may store instructions and code represented by data signals that may be executed by the processor 101. A cache memory (not shown) may reside inside processor 101 that stores data signals stored in memory 113. The cache speeds access to memory by the processor 101 by taking advantage of its locality of access. In an alternate embodiment of the computer system 100, the cache resides external to the processor 101. A bridge memory controller 111 is coupled to the CPU bus 110 and the memory 113. The bridge memory controller 111 directs data signals between the processor 101, the memory 113, and other components in the computer system 100 and bridges the data signals between the CPU bus 110, the memory 113, and a first IO bus 120.

The first IO bus 120 may be a single bus or a combination of multiple buses. The first IO bus 120 provides communication links between components in the computer system 100. A network controller 121 is coupled to the first IO bus 120. The network controller 121 may link the computer system 100 to a network of computers (not shown) and supports communication among the machines. A display device controller 122 is coupled to the first IO bus 120. The display device controller 122 allows coupling of a display device (not shown) to the computer system 100 and acts as an interface between the display device and the computer system 100.

A second IO bus 130 may be a single bus or a combination of multiple buses. The second IO bus 130 provides communication links between components in the computer system 100. A data storage device 131 is coupled to the second IO bus 130. The data storage device 131 may be a hard disk drive, a floppy disk drive, a CD-ROM device, a flash memory device or other mass storage device. An input interface 132 is coupled to the second IO bus 130. The input interface 132 may be, for example, a keyboard and/or mouse controller or other input interface. The input interface 132 may be a dedicated device or can reside in another device such as a bus controller or other controller. The input interface 132 allows coupling of an input device to the computer system 100 and transmits data signals from an input device to the computer system 100. A bus bridge 123 couples the first IO bus 120 to the second IO bus 130. The bus bridge 123 operates to buffer and bridge data signals between the first IO bus 120 and the second IO bus 130. It should be appreciated that computer systems having a different architecture may also be used to implement the computer system 100.

A system designer 140 may reside in memory 113 and be executed by one or more of the processors 101 and 105. The system designer 140 may operate to synthesize a system, place the system on a target device, route the system, and compute slack values for the system, where the slack values are computed in parallel utilizing the plurality of threads supported by the processor 101 and 105.

Figure 2:
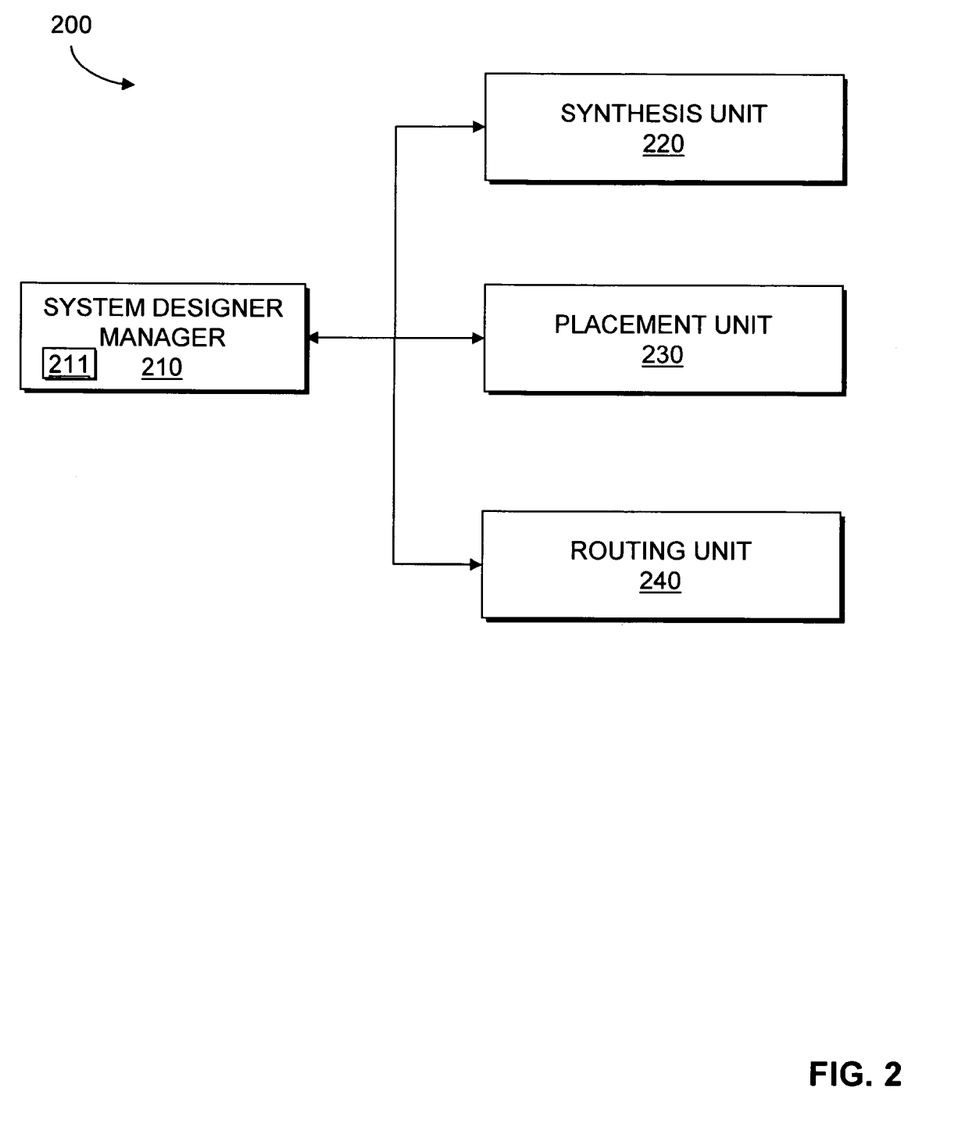
FIG. 2 illustrates a system designer according to an exemplary embodiment of the present invention.

FIG. 2 illustrates a system designer 200 according to an exemplary embodiment of the present invention. The system designer 200 may be used to implement the system designer 140 shown in FIG. 1. The system designer 200 may be an EDA tool for designing a system on a target device. The target device may be, for example, an application specific integrated circuit (ASIC), a structured ASIC, a field programmable gate array (FPGA), a programmable logic device (PLD), a printed circuit board (PCB), or other circuitry. FIG. 2 illustrates modules implementing an embodiment of the system designer 200. According to one embodiment, system design may be performed by a computer system (not shown) executing sequences of instructions represented by the modules shown in FIG. 2. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 200 includes a system designer manager 210. The system designer manager 210 is connected to and transmits data between the components of the system designer 200.

Block 220 represents a synthesis unit. The synthesis unit 220 generates a logic design of a system to be implemented in the target device. According to an embodiment of the system designer 200, the synthesis unit 220 takes a conceptual Hardware Description Language (HDL) design definition and generates an optimized logical representation of the system. The optimized logical representation of the system generated by the synthesis unit 220 may include a representation that has a minimized number of functional blocks and registers, such as logic gates and logic elements, required for the system. Alternatively, the optimized logical representation of the system generated by the synthesis unit 220 may include a representation that has a reduced depth of logic and that generates a lower signal propagation delay. The synthesis unit 220 also determines how to implement the functional blocks and registers in the optimized logic representation utilizing specific resources on a target device thus creating an optimized "technology-mapped" netlist. The technology-mapped netlist illustrates how the resources (components) on the target device are utilized to implement the system. In an embodiment where the target device is a FPGA, the components could be logical elements or adaptive logic modules. In an embodiment where the target device is an ASIC, the components could be gates or standard cells. In an embodiment where the target device is a structured ASIC, the technology-mapped netlist may contain components that can be implemented in the structured ASIC fabric, such as RAM blocks, multiplier blocks, and gates from a library of gates.

Block 230 represents a placement unit. The placement unit 830 places the system on to the target device by determining which components or areas on the target device are to be used for specific functional blocks and registers. According to an embodiment of the system designer 800, the placement unit 830 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 230 may utilize a cost function in order to determine a good assignment of resources on the target device.

Block 240 represents a routing unit. The routing unit 860 determines the routing resources on the target device to use to provide interconnection between the components implementing functional blocks and registers of the logic design.

The system designer manager 210 includes a timing analysis unit 211. The timing analysis unit 211 computes the slack on various portions on the system. According to one embodiment, slack may refer to the difference between the data arrival time (including skew and microparameters) and the data required time. The data arrival time represents the time that a data signal arrives at a register's data input port. The data required time represents the time that takes the clock active edge to arrive at a destination register's clock port minus an intrinsic setup time of the register. The timing analysis unit 211 may also compute slack ratios which may be defined as 1-slack/setup-constraint for various portions on the system.

According to an embodiment of the system designer manager 210, the timing analysis unit 211 may compute slack and slack ratios after synthesis, placement, and/or routing in order to confirm that the design for the system meets timing requirements and to evaluate solutions generated by the synthesis unit 220, placement unit 230, and routing unit 240. The results generated from the timing analysis unit 211 may be used to re-run one or more of the procedures performed by the synthesis unit 220, placement unit 230, and/or routing unit 240 in efforts to improve a solution.

According to an embodiment of the system designer manager 210, the timing analysis unit 211 identifies domains and sub-domains in the system and defines chunks from the domains and sub-domains. The timing analysis unit 211 distributes the chunks to threads supported by the processors 101 and 105 (shown in FIG. 1) for parallel slack computation.

Figure 3:
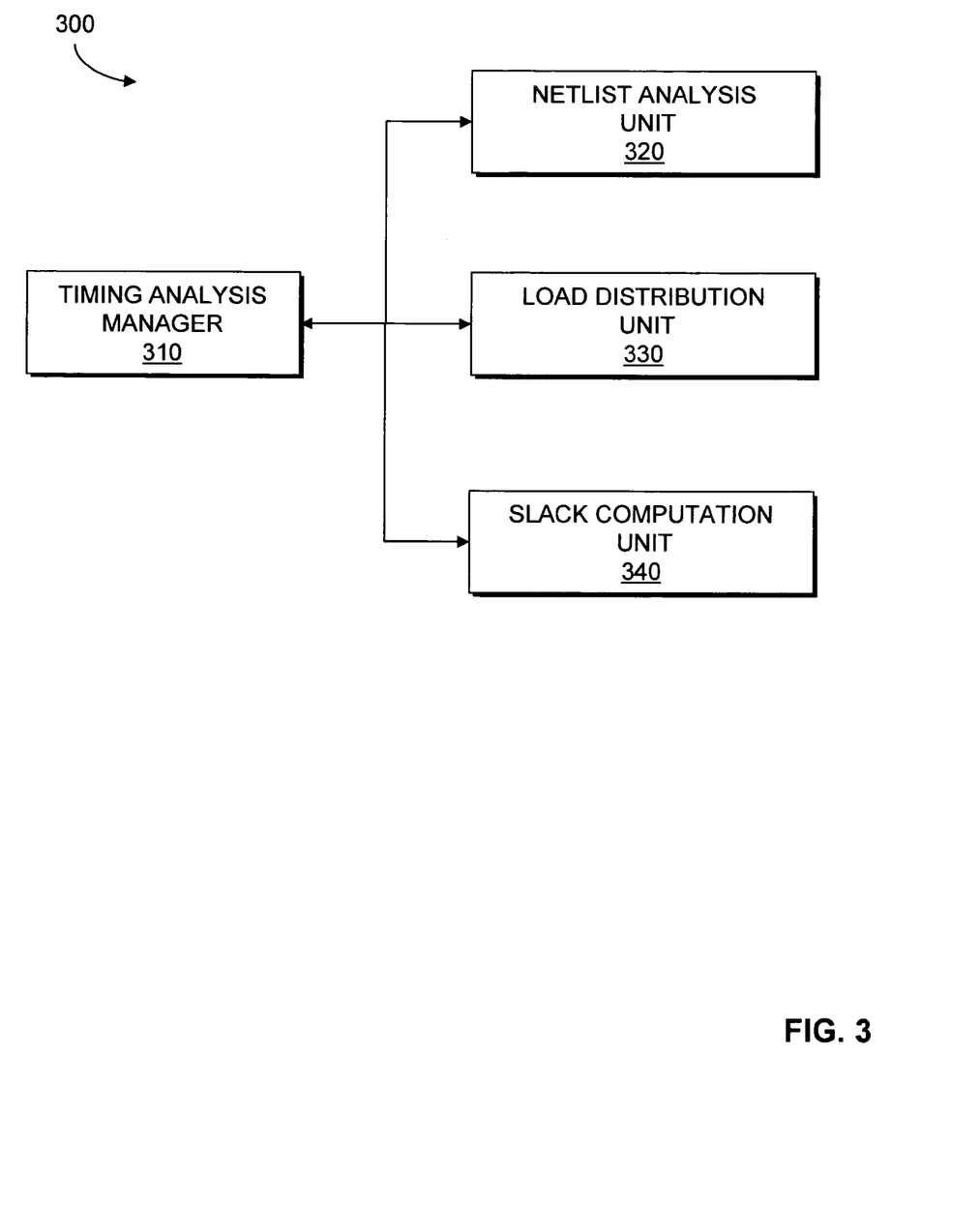
FIG. 3 is a block diagram of a timing analyzer unit according to an exemplary embodiment of the present invention.

FIG. 3 is a block diagram of a timing analysis unit 300 according to an exemplary embodiment of the present invention. The timing analysis unit 300 may be used to implement the timing analysis unit 211. The timing analysis unit 300 includes a timing analysis manager 310. The timing analysis manager 310 is connected to and transmits information between components in the timing analysis unit 300.

The timing analysis unit 300 includes a netlist analysis unit 320. The netlist analysis unit 320 parses a netlist and identifies domains and sub-domains in the netlist. The netlist may be one that is generated after synthesis, placement, or routing. According to an embodiment of the present invention, a domain may include a plurality of components (represented by nodes) and connections, interconnecting the components, that are driven by a single clock in a system. A sub-domain may include a path through a subset of the components and connections that are sourced by another domain. The sub-domain may include a subset of nodes and connections that are associated with a second clock. The sub-domain may also include a path through a subset of the nodes and connections that are subject to minimum and/or maximum delay constraints or that are not subject to any constraints (false path). According to an embodiment of the present invention, for false paths, the chunk does not need to be analyzed for slack computation. A timing exception may also occur for multicycle paths. For multicycle paths, delay constraints may be tightened or relaxed using a multiple of the source or destination clock period. It should be appreciated that a domain and sub-domain may be defined by other characteristics.

The timing analysis unit 300 includes a load distribution unit 330. The load distribution unit 330 defines portions of the system ("chunks") to be separately processed by a thread. According to an embodiment of timing analysis unit 300, the load distribution unit 330 may define a chunk to include an entire domain and all sub-domains associated with it. Alternatively, the load distribution unit 330 may define a chunk to include only a sub-domain, or a combination of the two. The load distribution unit 330 may be programmed by a user of a system designer to select a definition of a chunk, or the load distribution unit 330 may be pre-programmed to make this definition.

The load distribution unit 330 may assign each available thread supported by a computer system to process one of the chunks identified so that slack computation for the chunks may be performed in parallel. According to an embodiment of the timing analysis unit 300, the load distribution unit 330 may perform the procedures listed below which are written in the form of pseudo code.

```
create a queue of chunks
create n threads
assign available thread to a chunk in queue
for each thread, start processing chunk for slack
while chunk exists in queue
    for each thread
        if thread is done
            add results to domain total
            assign thread to next chunk
```

According to an embodiment of the load distribution unit 330, if it is determined that a chunk requires an amount of time to process that exceeds a threshold value, a number of additional procedures may be performed. According to one embodiment, if the chunk represents a domain, the chunk may be re-defined to form a plurality of chunks where each new chunk includes a sub-domain. This would allow the components of the domain to be processed in parallel. According to one embodiment, if the chunk represents a sub-domain, the chunk may be weighted for optimal scheduling. The optimal scheduling may involve scheduling processing of the chunk earlier in the schedule.

The timing analysis unit 300 includes a slack computation unit 340. The slack computation unit 340 computes slack for the chunks defined by the load distribution unit 330. According to an embodiment of the timing analysis unit 300, the slack computation unit 340 computes slack by performing two depth first searches. During the first depth first search, the slack computation unit 340 calculates data arrival times by adding the delays associated for each connection starting from the source nodes and ending at the destination nodes. During the second depth first search, the slack computation unit 340 calculates data required times by subtracting the delays associated for each connection starting from the destination nodes and ending at the source nodes. The slack is the computed as the difference between the data arrival and data required times. According to an embodiment of the present invention where each sub-domain in a system is associated with a separate chunk, there may be a plurality of slack values computed for a connection in the system. In this situation, the slack computation unit 340 may select a worst slack value to represent the slack for the connection. It should be appreciated that other procedures and techniques may be used by the slack computation unit 340 to compute slack. According to an embodiment of the present invention, the results generated from the slack computation unit 340 may be stored in a separate data structure outside a netlist.

Figure 4:
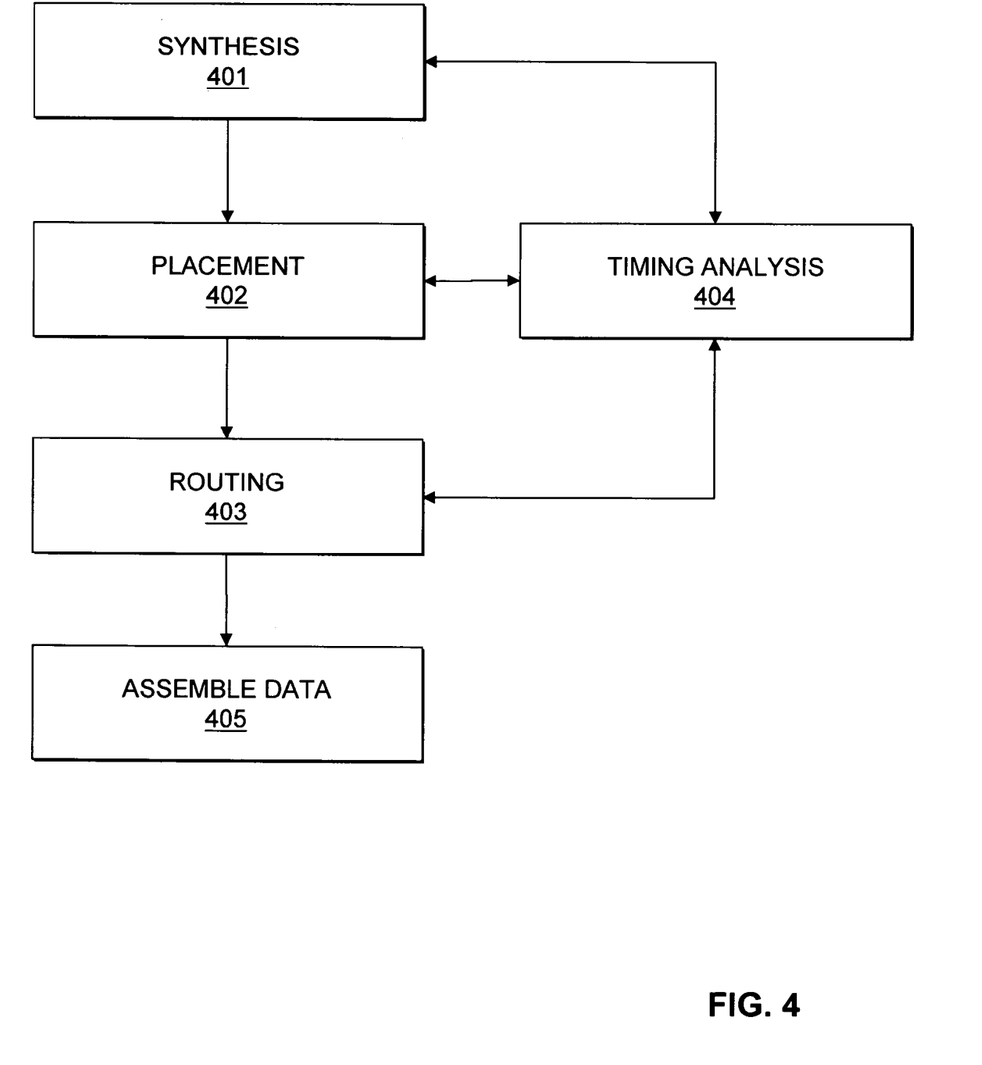
FIG. 4 is a flow chart illustrating a method for designing a system according to an exemplary embodiment of the present invention.

FIG. 4 is a flow chart illustrating a method for designing a system according to an exemplary embodiment of the present invention. At 401, the system is synthesized. Synthesis includes generating a logic design of the system to be implemented. According to an embodiment of the present invention, synthesis generates an optimized logical representation of the system from a HDL design definition. The optimized logical representation of the system may include a representation that has a minimized number of functional blocks and registers, such as logic gates and logic elements, required for the system. Synthesis also includes mapping the optimized logic design (technology mapping). Mapping includes determining how to implement logic gates and logic elements in the optimized logic representation with resources (components) available on the target device. According to an embodiment of the present invention, a netlist is generated from mapping. This netlist may be an optimized technology-mapped netlist generated from the HDL.

At 402, the mapped logical system design is placed. Placement works on the optimized technology-mapped netlist to produce a placement for each of the functional blocks. According to an embodiment of the present invention, placement includes fitting the system on the target device by determining which components on the logic design are to be used for specific logic elements, and other function blocks. Placement may include clustering which involves grouping logic elements together to form the logic clusters present on the target device.

At 403, the placed design is routed. Routability optimization may be performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 404, timing analysis is performed on various portions of the system. Timing analysis may include the computation of slack for the various portions on the system. According to one embodiment, slack may refer to the difference between the data arrival time (including skew and microparameters) and the data required time. The slack may be computed after synthesis, placement, or routing in order to confirm that the design for the system meets timing requirements and/or to evaluate solutions generated by the synthesis, placement, or routing. The results generated from slack computation may be used to re-run one or more of the procedures performed for synthesis, placement, and/or routing in efforts to improve a solution.

According to an embodiment of the present invention, domains and sub-domains in the system are identified and chunks are defined from the domains and sub-domains. Slack values may be computed in parallel by distributing the chunks to threads supported by one or more processors or processor cores.

At 405, an assembly procedure is performed. The assembly procedure involves creating a data file that includes information determined by the compilation procedure described by 401-404. The data file may be a bit stream that may be used to program a target device.

Figure 5:
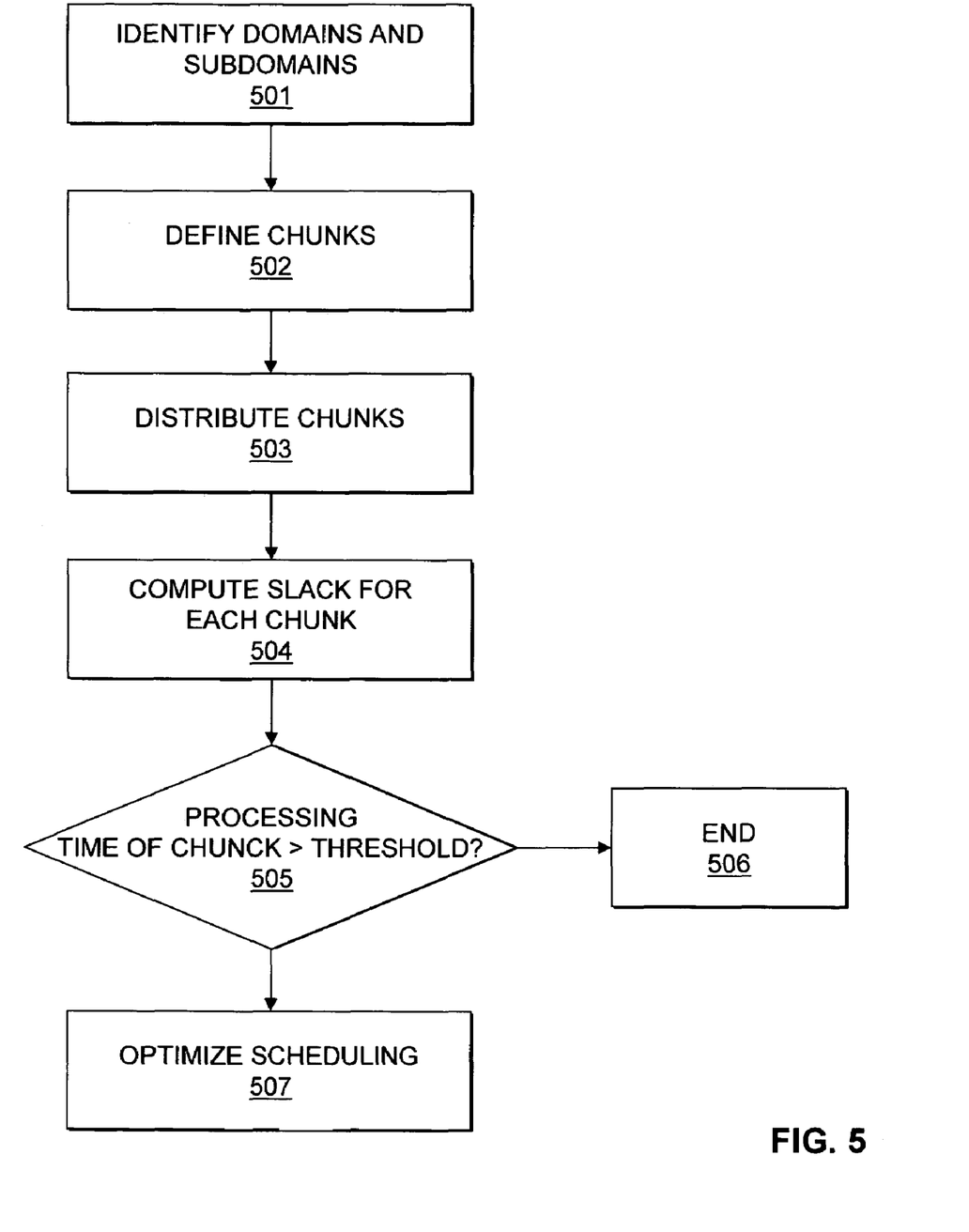
FIG. 5 is a flow chart illustrating a method for performing timing analysis according to an embodiment of the present invention.

FIG. 5 is a flow chart illustrating a method for performing timing analysis according to an embodiment of the present invention. It should be appreciated that a "sign-off" timing analysis procedure may be added. The sign-off timing analysis provides the user with a report on whether or not the design meets timing.

FIG. 5 is a flow chart illustrating a method for performing timing analysis according to an exemplary embodiment of the present invention. The procedures shown in FIG. 5 may be used to implement 404 shown in FIG. 4. At 501, domains and sub-domains are identified. According to an embodiment of the present invention, a netlist is parsed to identify domains and sub-domains. The net list may be generated after synthesis, placement, or routing. According to an embodiment of the present invention, a domain may include a plurality of components (represented by nodes) and connections, interconnecting the components, that are driven by a single clock in a system. A sub-domain may include a path through a subset of the components and connections that are sourced by another domain. The sub-domain may include a subset of nodes and connections that are associated with a second clock. The sub-domain may also include a path through a subset of the nodes and connections that are subject to minimum and/or maximum delay constraints or that are not subject to any constraints (false path). According to an embodiment of the present invention, for false paths, the chunk does not need to be analyzed for slack computation. A timing exception may also occur for multicycle paths. For multicycle paths, delay constraints may be tightened or relaxed using a multiple of the source or destination clock period. It should be appreciated that a domain and sub-domain may alternatively be defined by other characteristics.

At 502, chunks are defined from the domains and sub-domains identified. According to an embodiment of the present invention a chunk may be defined to include an entire domain and all sub-domains associated with it. Alternatively, a chunk may be defined to include only a sub-domain, or a combination of the two.

At 503, the chunks are distributed. According to an embodiment of the present invention, the chunks may be assigned to available thread supported by a computer system. The threads may be executed in parallel to allow slack computation to be performed in parallel.

At 504, slack is computed for each of the chunks. According to an embodiment of the present invention, for each chunk a two depth first searches are performed. After performing the depth first search, the delay associated for each connection is summed starting from the destination and ending at the source. During the first depth first search, data arrival times are calculated by adding the delays associated for each connection starting from the source nodes and ending at the destination nodes. During the second depth first search, data required times are calculated by subtracting the delays associated for each connection starting from the destination nodes and ending at the source nodes. The slack is the computed as the difference between the data arrival and data required times. Slack computation for a path may also involve selecting a slack value from a plurality of slack values computed for a connection. In one embodiment, the worst case slack value is selected.

At 505, it is determined whether the time for processing a chunk exceeds a threshold value. If the time for processing the chunk does not exceed the threshold value, control proceeds to 506. If the time for processing the chunk exceeds the threshold value, control proceeds to 507.

At 506, control terminates the procedure.

At 507, the scheduling of processing the chunk is optimized. According to an embodiment of the present invention, if the chunk represents a domain, the chunk may be re-defined to form a plurality of chunks where each new chunk includes a sub-domain. This would allow the domain to be processed in parallel. According to an embodiment of the present invention, if the chunk represents a sub-domain, the chunk may be weighted for optimal scheduling. The optimal scheduling may involve scheduling processing of the chunk earlier in the schedule.

Figure 6:
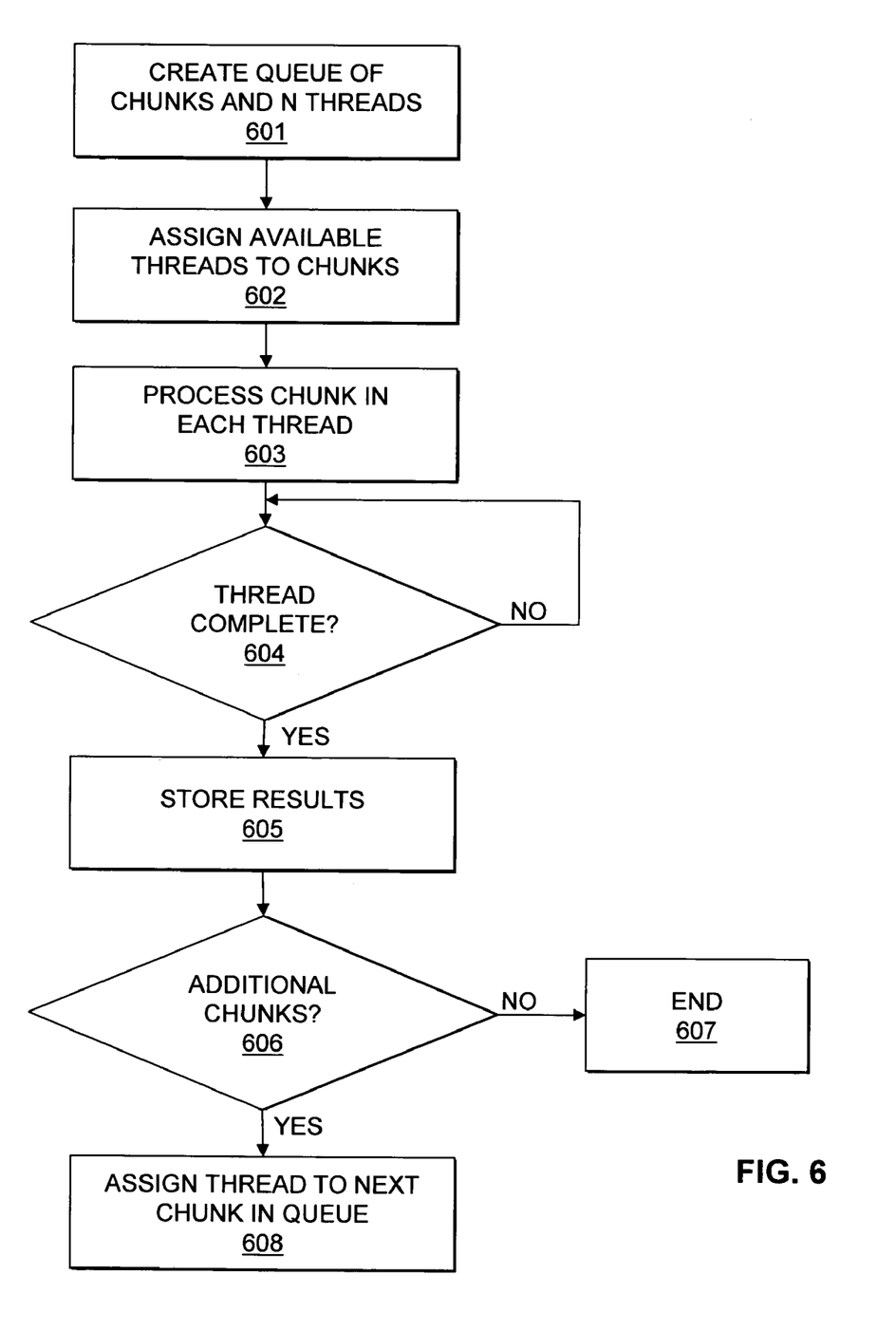
FIG. 6 is a flow chart illustrating a method for performing parallel slack computation according to an exemplary embodiment of the present invention.

FIG. 6 is a flow chart illustrating a method for performing parallel slack computation according to an exemplary embodiment of the present invention. The procedures illustrated in FIG. 6 may be used to implement 503 and 504 shown in FIG. 5. At 601, a queue of chunks and n threads are created, where n may be any number.

At 602, the n threads are assigned to chunks in the queue.

At 603, the chunks in each thread are processed.

At 604, it is determined whether a thread is complete. If a thread is not complete, control returns to 604. If a thread is complete, control proceeds to 605.

At 605, the results are stored. According to an embodiment of the present invention, the results are stored outside a netlist. It should be appreciated that the stored results may be partial or intermediate results. In this case, the partial or intermediate results may be selected and summed at a later time.

At 606, it is determined if additional chunks are in the queue. If additional chunks are not in the queue, control proceeds to 607. If additional chunks are in the queue, control proceeds to 608.

At 607, control terminates the process.

At 608, the thread is assigned to a next chunk in the queue.

FIGS. 4-6 are flow charts that illustrate embodiments of the present invention. Some of the techniques illustrated may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium" or "machine readable medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, comprising:
   identifying domains and sub-domains in the system;
   defining chunks from the domains and sub-domains;
   computing slacks for the chunks in parallel;
   identifying a chunk associated with a domain that requires a period of time to compute slack that exceeds a threshold value; and
   re-defining the chunk associated with the domain into a plurality of chunks each having a sub-domain in response to exceeding the threshold value, wherein one of the identifying, defining, computing, and re-defining procedures is performed by a processor.

2. The method of claim 1, wherein identifying the domains comprises identifying a set of nodes in a netlist, that are associated with components in the system, and connections interconnecting the components that are driven by a clock in the system.

3. The method of claim 1, wherein identifying the sub-domains comprises identifying a path through a subset of nodes and connections that are sourced by another domain.

4. The method of claim 1, wherein identifying the sub-domains comprises identifying a path through a subset of nodes and connections that are associated with a second clock.

5. The method of claim 1, wherein identifying the sub-domains comprises identifying a path through a subset of nodes and connections that include at least one of a minimum and maximum delay constraint.

6. The method of claim 1, wherein identifying the sub-domains comprise identifying a path through a subset of nodes and connections that is a false path.

7. The method of claim 1, wherein defining chunks from the domains and sub-domains comprises defining each sub-domain as a chunk.

8. The method of claim 1, wherein defining chunks from the domains and sub-domains comprises defining each domain as a chunk.

9. The method of claim 1, further comprising computing slack for each of the plurality of chunks in parallel.

10. The method of claim 1, wherein computing the slacks for the chunks in parallel comprises assigning a separate thread to process each of the chunks.

11. The method of claim 1, further comprising:
    synthesizing the system;
    placing the system on the target device; and
    routing the system, wherein the slacks are computed after one of the synthesizing, placing, and routing procedures.

12. The method of claim 1, further comprising revising a routing procedure in response to the slacks computed.

13. An article of manufacture comprising a machine accessible medium including sequences of instructions, the sequences of instructions including instructions which when executed cause the machine to perform:
    identifying domains and sub-domains in a system;
    defining chunks from the domains and sub-domains; and
    computing slacks for the chunks in parallel prior to assembling a design for the system into a data file after performing synthesis, placement, and routing of the system.

14. The article of manufacture of claim 13, wherein identifying the domains comprises identifying a set of nodes in a netlist that are associated with components in the system and connections interconnecting the components that are driven by a clock in the system.

15. The article of manufacture of claim 13, wherein identifying the sub-domains comprises identifying a path through a subset of nodes and connections that are sourced by another domain.

16. The article of manufacture of claim 13, further comprising instructions which when executed causes the machine to further perform revising one of a synthesizing, placing, and routing procedure in response to the slacks computed.

17. The article of manufacture of claim 13, further comprising instructions which when executed causes the machine to further perform:
    identifying a chunk associated with a domain that requires a period of time to compute slack that exceeds a threshold value; and
    re-defining the chunk associated with the domain into a plurality of chunks each having a sub-domain in response to exceeding the threshold value.

18. A a timing analysis unit, comprising:
    a netlist analysis unit to identify domains and sub-domains in a system;
    a load distribution unit to define chunks from the domains and sub-domains and to re-define a chunk associated with a domain into a plurality of chunks each having a sub-domain in response to determining that the chunk requires a period of time to compute slack that exceeds a threshold value; and
    a slack computation unit to compute slack for two or more chunks in parallel.

19. The timing analysis unit of claim 18, wherein the load distribution unit assigns the chunks to threads to compute slacks in parallel.

20. The timing analysis unit of claim 18, wherein the slack computation unit computes slack by performing a depth first search of the system.

21. The timing analysis unit of claim 18, wherein the load distribution unit allows a user to select a definition of a chunk.

* * * * *